(12) United States Patent
Kajimoto et al.

(10) Patent No.: US 10,612,161 B2
(45) Date of Patent: Apr. 7, 2020

(54) GAN SUBSTRATE

(71) Applicant: MITSUBISHI CHEMICAL CORPORATION, Tokyo (JP)

(72) Inventors: Tetsuharu Kajimoto, Ushiku (JP); Yusuke Tsukada, Ushiku (JP); Masayuki Tashiro, Ushiku (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 278 days.

(21) Appl. No.: 15/625,019

(22) Filed: Jun. 16, 2017

(65) Prior Publication Data

US 2017/0362739 A1 Dec. 21, 2017

Related U.S. Application Data

(63) Continuation of application No. PCT/JP2015/082439, filed on Nov. 18, 2015.

(30) Foreign Application Priority Data

Dec. 16, 2014 (JP) .................................. 2014-254462
Jan. 22, 2015 (JP) .................................. 2015-010670
Jul. 14, 2015 (JP) .................................. 2015-140702

(51) Int. Cl.
C30B 29/40 (2006.01)
C30B 25/20 (2006.01)
(Continued)

(52) U.S. Cl.
CPC ............ C30B 29/406 (2013.01); C30B 25/20 (2013.01); H01L 29/045 (2013.01); (Continued)

(58) Field of Classification Search
None
See application file for complete search history.

(56) References Cited

U.S. PATENT DOCUMENTS

2004/0245535 A1* 12/2004 D'Evelyn .............. H01L 33/32
257/94
2009/0236694 A1 9/2009 Mizuhara et al.
(Continued)

FOREIGN PATENT DOCUMENTS

JP 2006-315947 A 11/2006
JP 2008-143772 A 6/2008
(Continued)

OTHER PUBLICATIONS

International Search Report dated Jan. 12, 2016 for the corresponding PCT Application No. PCT/JP2015/082439.
(Continued)

Primary Examiner — David Sample
Assistant Examiner — Elizabeth Collister
(74) Attorney, Agent, or Firm — Leason Ellis LLP

(57) ABSTRACT

A disk-shaped GaN substrate has a diameter of 2 inches or more has a front surface tilted with a tilt angle of 45° or more and 135° or less relative to the (0001) plane in a tilt direction within a range of ±5° around the <10-10> direction, and a back surface which is a main surface opposite to the front surface. The GaN substrate has a first point positioned in a direction perpendicular to the c-axis when viewed from the center thereof, on the side surface thereof. A single diffraction peak appears in an X-ray diffraction pattern obtained by θ scan in which an X-ray (CuKα$_1$: wavelength: 0.1542 nm) is incident to the first point and the incident angle θ of the incident X-ray is varied while the 2θ angle of the diffracted X-ray is fixed to twice the Bragg angle of 28.99° of the {11-20} plane.

15 Claims, 21 Drawing Sheets

(51) Int. Cl.
  *H01L 29/04* (2006.01)
  *H01L 29/20* (2006.01)
  *H01L 29/778* (2006.01)
  *H01L 33/32* (2010.01)

(52) U.S. Cl.
  CPC ........ *H01L 29/2003* (2013.01); *H01L 29/778* (2013.01); *H01L 33/32* (2013.01)

(56) References Cited

U.S. PATENT DOCUMENTS

| | | | |
|---|---|---|---|
| 2011/0068434 A1* | 3/2011 | Yamaguchi | C30B 29/406 257/615 |
| 2011/0108852 A1 | 5/2011 | Fujiwara et al. | |
| 2013/0072005 A1 | 3/2013 | Fujikura | |
| 2013/0119401 A1* | 5/2013 | D'Evelyn | H01L 21/02609 257/76 |
| 2013/0134434 A1* | 5/2013 | Mikami | B82Y 20/00 257/76 |

FOREIGN PATENT DOCUMENTS

| | | |
|---|---|---|
| JP | 2011-126749 A | 6/2011 |
| JP | 2011-230955 A | 11/2011 |
| JP | 2013-060349 A | 4/2013 |
| JP | 2014-028720 A | 2/2014 |
| JP | 2014-043388 A | 3/2014 |
| JP | 2014-118323 A | 6/2014 |

OTHER PUBLICATIONS

Po Shan Hsu et al., "Stress relaxation and critical thickness for misfit dislocation formation in (100) and (30) InGaN/GaN heteroepitaxy", *Applied Physics Letters*, Apr. 27, 2012, pp. 171917-1-171917-4, vol. 100.

Notification of Transmittal of Translation of the International Preliminary Report on Patentability dated Jun. 29, 2017 for the corresponding PCT Application No. PCT/JP2015/082439.

Notice of Reasons for Refusal dated Jun. 18, 2019 for the corresponding Japanese Patent Application No. 2016-104578.

* cited by examiner

GAN SUBSTRATE

CROSS-REFERENCE TO RELATED APPLICATION

This application is a continuation of International Application No. PCT/JP2015/082439, filed on Nov. 18, 2015, and designated the U.S., and claims priority from Japanese Patent Application No. 2014-254462 which was filed on Dec. 16, 2014, Japanese Patent Application No. 2015-010670 which was filed on Jan. 22, 2015, and Japanese Patent Application No. 2015-140702 which was filed on Jul. 14, 2015, the entire contents of which are incorporated herein by reference.

TECHNICAL FIELD

The present invention relates to a GaN substrate.

BACKGROUND ART

GaN is one of Group III-V compound semiconductors, and has a wurtzite-type crystal structure belonging to a hexagonal system.

A GaN substrate is a substrate configured by only a GaN crystal. A C-plane GaN substrate is commercially produced, and is mainly used as a substrate for InGaN-based light-emitting devices (laser diodes and light-emitting diodes).

On the other hand, a non-polar or semi-polar GaN substrate attracts attention as a new substrate for nitride semiconductor devices including a light-emitting device (Non-Patent Document 1).

Non-polar GaN substrates which particularly attract attention include an M-plane substrate, namely, a (10-10) substrate. Semi-polar GaN substrates which particularly attract attention include a (20-21) substrate, a (20-2-1) substrate, a (30-31) substrate and a (30-3-1) substrate.

The name of crystal plane or Miller index, attached to the name of a GaN substrate, is that of a low index plane parallel to or most nearly parallel to the front surface of the substrate. The front surface refers to a surface intended to be used for formation of a semiconductor device or epitaxial growth of a crystal, of two main surfaces of the substrate. Another main surface which is not the front surface is referred to as the back surface.

Therefore, a GaN substrate called an "M-plane substrate" or "(10-10) substrate" is a GaN substrate whose low index plane parallel to or most nearly parallel to the front surface thereof is an M-plane, namely, {10-10}. A crystal plane where the absolute values of all the integers h, k, m and l of the Miller indices {hkml} are 3 or less is usually a low index plane.

A non-polar or semi-polar GaN substrate can be produced by a method where a bulk GaN crystal grown on a C-plane GaN template in the c-axis direction by use of an HVPE method is sliced parallel to a desired non-polar or semi-polar plane.

The non-polar or semi-polar GaN substrate produced by this method, however, has an elongated shape and its size in the direction of the orthogonal projection of the c-axis on its main surface is in the order of millimeters. The reason is that the thickness of a bulk GaN crystal with low dislocation density, which can be stably grown on a C-plane GaN template by an HVPE method, is in the order of millimeters. This method cannot provide a large-area substrate like a 2-inch substrate (disk-shaped substrate having a diameter of 2 inches).

In order to solve the above problem, a tiling method is proposed. In the tiling method, a GaN crystal is grown on an aggregate seed. The aggregate seed is configured by closely arranging a plurality of GaN substrates (tile seeds) having the same plane orientation, on a planar surface, and one example thereof is illustrated in FIG. 1.

With reference to FIG. 1, four tile seeds 10 are arranged on a flat surface to configure one aggregate seed S10. An HVPE method can be used to grow a GaN crystal 20 on a main surface of the aggregate seed S10 in a normal direction of the main surface, as illustrated in FIG. 2. That is, a GaN crystal 20 collectively covering the plurality of tile seeds 10 can be grown (Patent Document 1 and 2).

The GaN crystal grown on the aggregate seed is processed into a disk-shaped GaN substrate. Alternatively, a seed substrate is again produced from the GaN crystal, and a GaN crystal epitaxially grown on the seed substrate by a vapor phase method is processed into a disk-shaped GaN substrate.

As illustrated in FIG. 3, a flat surface called an "orientation flat (OF)" is provided on the outer circumference of a disk-shaped GaN substrate.

In a plain view of the substrate, the outer circumference forms a straight line where the OF is provided. The length of such portion where the outer circumference forms a straight line is called an "OF length". The OF length is demanded to be less than 20 mm for a substrate having a nominal diameter of 2 inches (about 5 cm), less than 40 mm for a substrate having a nominal diameter of 4 inches (about 10 cm), and less than 60 mm for a substrate having a nominal diameter of 6 inches (about 15 cm).

PRIOR ART DOCUMENT

Patent Document

Patent Document 1: JP-A-2006-315947
Patent Document 2: JP-A-2008-143772

Non-Patent Document

Non-Patent Document 1: Po Shan Hsu, Matthew T. Hardy, Erin C. Young, Alexey E. Romanov, Steven P. DenBaars, Shuji Nakamura, and James S. Speck, Applied Physics Letters 100, 171917 (2012)

SUMMARY OF THE INVENTION

Technical Problem

As described below in detail, the present inventors have performed an experiment where a square M-plane GaN substrate whose sizes in the a-axis direction and the c-axis direction are 52 mm is used for a seed to grow a GaN crystal by an HVPE method, thereby producing an M-plane GaN substrate having a diameter of 50 mm from the GaN crystal. Meanwhile, when OF parallel to {11-20} was tried to be formed at the a-axis direction edge of the produced M-plane GaN substrate, such OF was difficult to form with high accuracy. The reason is that, when θ scan was performed with an X-ray incident on a temporary OF formed by cutting off the a-axis direction edge of the M-plane GaN substrate, no diffraction peak from {11-20} appeared in the resulting X-ray diffraction pattern, and the surface orientation of the temporary OF was not able to be accurately identified.

The present invention has been completed in the course of studies performed by the present inventors for solving the problem, and a main object thereof is to provide a non-polar or semi-polar GaN substrate which has a nominal diameter of 2 inches (about 5 cm) or more, and does not have a part remarkably decreased in crystallinity at the edge in a direction perpendicular to the c-axis.

Solution to Problem

Aspects of the present invention include the following GaN substrates.
(1) A disk-shaped GaN substrate having a diameter of 45 mm or more and 80 mm or less, a front surface tilted with a tilt angle of 45° or more and 135° or less relative to the (0001) plane in a tilt direction within a range of ±5° around the <10-10> direction, and a back surface which is a main surface opposite to the front surface, wherein the GaN substrate is configured by one single crystal region or comprises a plurality of single crystal regions arranged in a row along the direction of the orthogonal projection of the c-axis on the front surface and each exposed on both the front surface and the back surface; the GaN substrate has on a side surface thereof a first point which is positioned in a direction perpendicular to the c-axis when viewed from the center of the substrate, and a single diffraction peak appears in an X-ray diffraction pattern obtained by θ scan in which an X-ray (CuKα$_1$: wavelength: 0.1542 nm) is incident to the first point and the incident angle θ of the incident X-ray is varied while the 2θ angle of the diffracted X-ray is fixed to twice the Bragg angle of 28.99° of the {11-20} plane.
(2) The GaN substrate according to (1), having the first point on an orientation flat with a length of less than 20 mm provided on the outer circumference of the substrate.
(3) A disk-shaped GaN substrate having a diameter of 70 mm or more, a front surface tilted with a tilt angle of 45° or more and 135° or less relative to the (0001) plane in a tilt direction within a range of ±5° around a <10-10> direction, and a back surface which is a main surface opposite to the front surface, wherein the GaN substrate has on a side surface thereof a first point positioned in a direction perpendicular to a c-axis when viewed from the center of the substrate, and a single diffraction peak appears in an X-ray diffraction pattern obtained by θ scan in which an X-ray (CuKα$_1$: wavelength: 0.1542 nm) is incident to the first point and the incident angle θ of the incident X-ray is varied while the 2θ angle of the diffracted X-ray is fixed to twice the Bragg angle of 28.99° of the {11-20} plane.
(4) The GaN substrate according to (3), which has a diameter of 95 mm or more and 105 mm or less, and comprises a plurality of single crystal regions arranged in a row or two rows along the direction of the orthogonal projection of the c-axis on the front surface, wherein each of the plurality of single crystal regions is exposed on both the front surface and the back surface.
(5) The GaN substrate according to (3) or (4), which has a diameter of 105 mm or less, and has the first point on an orientation flat with a length of less than 40 mm provided on the outer circumference of the substrate.
(6) The GaN substrate according to (3), which has a diameter of 145 mm or more and 155 mm or less, and comprises a plurality of single crystal regions arranged in two rows or three rows along the direction of the orthogonal projection of the c-axis on the front surface, wherein each of the plurality of single crystal regions is exposed on both the front surface and the back surface.
(7) The GaN substrate according to (3) or (6), which has a diameter of 145 mm or more and 155 mm or less, and has the first point on an orientation flat with a length of less than 60 mm provided on the outer circumference of the substrate.
(8) The GaN substrate according to any one of (1) to (7), wherein a half-value width of the diffraction peak is less than 0.5°.
(9) The GaN substrate according to any one of (1) to (8), wherein a low index plane most nearly parallel to the front surface is any crystal plane selected from {10-10}, {30-31}, {30-3-1}, {20-21}, {20-2-1}, {30-32}, {30-3-2}, {10-11} and {10-1-1}.
(10) The GaN substrate according to any one of (1) to (9), comprising a GaN crystal having concentrations of alkali metals and halogen of less than $1\times10^{15}$ cm$^{-3}$ and an absorption coefficient at 450 nm of 2 cm$^{-1}$ or less.
(11) The GaN substrate according to any one of (1) to (10), comprising a GaN crystal which gives an infrared absorption spectrum where a peak assigned to a gallium vacancy-hydrogen complex is not observed between 3,100 and 3,500 cm$^{-1}$.

Effect of the Invention

The present invention provides a non-polar or semi-polar GaN substrate which has a nominal diameter of 2 inches (about 5 cm) or more, and does not have apart remarkably decreased in crystallinity at the edge in a direction perpendicular to the c-axis. Use of such GaN substrate is advantageous in production of a nitride semiconductor device at a high yield.

BRIEF DESCRIPTION OF THE DRAWINGS

FIG. 6A illustrates an aggregate seed and a bulk GaN crystal grown thereon,
and FIG. 6B illustrates a state where the bulk GaN crystal is sliced.
FIG. 7A illustrates a seed substrate and a bulk GaN crystal grown thereon,
and FIG. 7B illustrates a state where the bulk GaN crystal is sliced.

DESCRIPTION OF EMBODIMENTS

Figure 1:
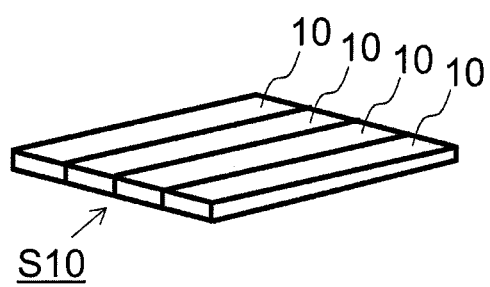
FIG. 1 is a perspective view illustrating a configuration example of an aggregate seed.
Figure 2:
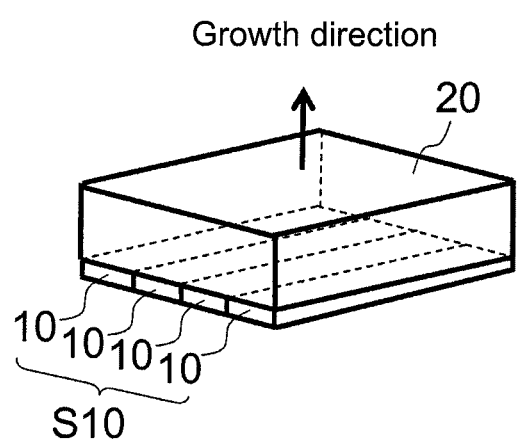
FIG. 2 is a perspective view illustrating a state where a bulk GaN crystal is grown on an aggregate seed.
Figure 3:
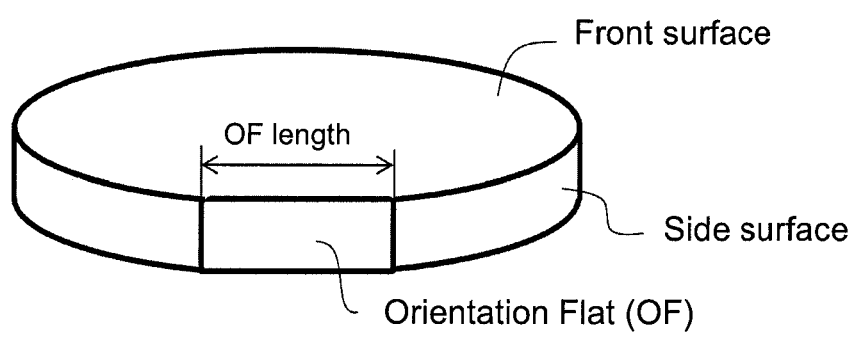
FIG. 3 is a perspective view illustrating a disk-shaped GaN substrate with an orientation flat formed thereon.

In a GaN crystal, a crystal axis parallel to [0001] and [000-1] is called a "c-axis", a crystal axis parallel to <10-10> is called an "m-axis", and a crystal axis parallel to <11-20> is called an "a-axis". In addition, a crystal plane perpendicular to the c-axis is called a "C-plane", a crystal plane perpendicular to the m-axis is called an "M-plane", and a crystal plane perpendicular to the a-axis is called an "A-plane".

Herein, references to a crystal axis, a crystal plane, a crystal orientation, and the like mean references to a crystal axis, a crystal plane, a crystal orientation, and the like of a GaN crystal, unless otherwise noted.

Hereinafter, the present invention is described with reference to embodiments.

1. GaN Substrate

The GaN substrate of the present invention is configured by only a GaN crystal. The conductivity and the conduction type of the GaN crystal are not limited.

While a GaN crystal exhibits a low n-type conductive property even if undoped, oxygen (O), silicon (Si), germanium (Ge), and the like may be added as impurities thereto when a sufficient n-type carrier concentration is required. Magnesium (Mg), zinc (Zn), and the like are known as impurities to be added for imparting p-type conductivity to a GaN crystal. Iron (Fe) and the like are known as impurities to be added for making a GaN crystal insulating.

The GaN crystal configuring the GaN substrate of the present invention is grown by a vapor phase method typified by an HVPE method.

By using an HVPE method, a GaN crystal where the concentration of undesired impurities is suppressed at a low level is more easily grown as compared with a flux method and an ammonothermal method.

For example, a flux method has a problem in providing a GaN crystal with a reduced alkali metal concentration (JP-A-2009-18961). The same is true on an ammonothermal method using an alkali metal as a mineralizer (JP-A-2011-523931). On the contrary, a GaN crystal grown by an HVPE method usually has a total alkali metal concentration of lithium (Li), sodium (Na) and potassium (K), of less than $1 \times 10^{15}$ cm$^{-3}$.

Furthermore, the GaN crystal grown by an HVPE method usually has a concentration of halogen such as chlorine and fluorine, of less than $1 \times 10^{15}$ cm$^{-3}$.

The concentrations of alkali metals and halogen can be measured by dynamic SIMS (Secondary Ion Mass Spectroscopy). Low concentrations of alkali metals and halogen in a crystal configuring a GaN substrate are advantageous to enhance reliability of a nitride semiconductor device to be formed thereon.

The GaN crystal grown by an HVPE method is also characteristic in having high transparency in near-ultraviolet to visible wavelength region, and therefore is suitable for a material of a GaN substrate for use in a light-emitting device. For example, while the absorption coefficient of a GaN crystal grown by an ammonothermal method is 4 to 20 cm$^{-1}$ at 450 nm, which is an emission wavelength of a excitation blue LED used in white LEDs, the absorption coefficient of the GaN crystal grown by an HVPE method is 2 cm$^{-1}$ or less at that wavelength (T. Hashimoto, et al., Sensors and Materials, Vol. 25, No. 3 (2013) 155-164).

Furthermore, the GaN crystal grown by an HVPE method is different from the GaN crystal grown by an ammonothermal method in that any peak assigned to a gallium vacancy-hydrogen complex is not observed between 3,100 and 3,500 cm$^{-1}$ of the infrared absorption spectrum thereof (International Publication No. WO2004/061923).

The GaN substrate of the present invention has a disk shape, and the diameter thereof is usually 45 mm or more and 305 mm or less. Typical diameters include 2 inches (45 to 55 mm), 3 inches (70 to 80 mm), 4 inches (95 to 105 mm), and 6 inches (145 to 155 mm). With respect to a substrate having a nominal diameter of 2 inches, a diameter preferred by most consumers is 48 mm or more, and more preferably 49 mm or more.

The GaN substrate of the present invention has a front surface. The front surface means a surface which is one of two main surfaces of a substrate and which is intended to be used for formation of a semiconductor device or epitaxial growth of a crystal. A main surface opposite to the front surface is called a "back surface". Both main surfaces can also be finished so as to be usable for formation of a semiconductor device or epitaxial growth of a crystal, and in such a case, it may be assumed that either one of the main surfaces is the front surface and the other thereof is the back surface.

The GaN substrate of the present invention has a front surface tilted with a tilt angle of 45° or more and 135° or less relative to the (0001) plane in a tilt direction within a range of ±5° around the <10-10> direction. The tilt direction is preferably a direction within a range of ±2.5° around the <10-10> direction, more preferably a direction within a range of ±1° around the <10-10> direction, most preferably a direction within a range of ±0.5° around the <10-10> direction.

The low index plane most nearly parallel to the front surface of the GaN substrate of the present invention can be any plane selected from {10-11}, {30-32}, {20-21}, {30-31}, {10-10}, {30-3-1}, {20-2-1}, {30-3-2} and {10-1-1}. Tilt direction of all of these crystal planes relative to the (0001) plane is the <10-10> direction. The tilt angle relative to the (0001) plane is, for example, 62° for {10-11}, 90° for {10-10}, and 118° for {10-1-1}.

In the present invention, the "first point" is defined as follows. The "first point" is defined as a point which is on a side surface of a disk-shaped GaN substrate and which is positioned in a direction perpendicular to the c-axis when viewed from the center of the substrate.

As described with reference to FIGS. 4A-B, the midpoint of a line segment connecting a center Cf of the front surface and a center Cb of the back surface corresponds to a center C of the substrate.

Figure 4A:
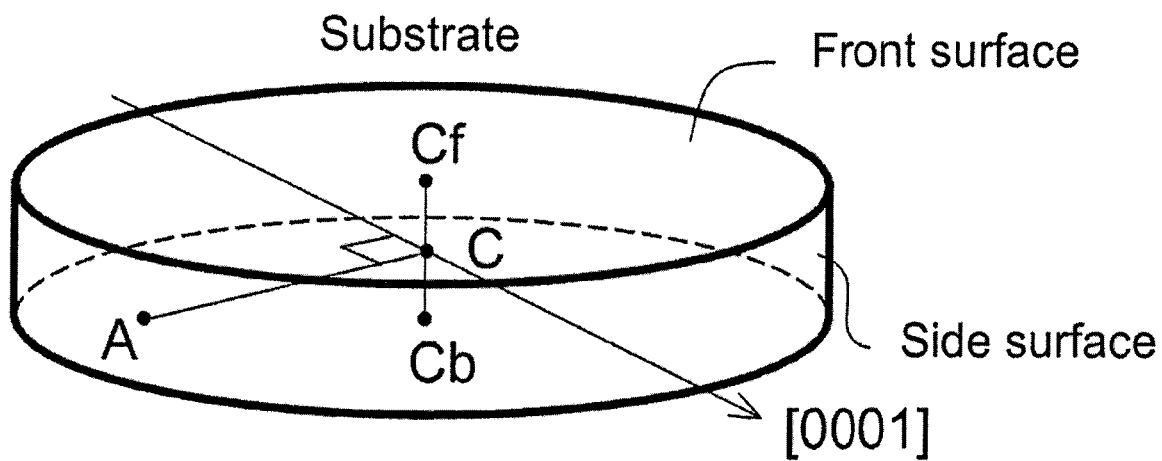
FIG. 4A and FIG. 4B are each a perspective view of a disk-shaped GaN substrate, for describing a "first point".

As illustrated in FIG. 4A, when a point A on the side surface of the substrate is the "first point", namely, is positioned in a direction perpendicular to the c-axis when viewed from the center C of the substrate, a straight line AC connecting the point A and the center C of the substrate perpendicularly intersects, at the center C of the substrate, a straight line which passes through the center C of the substrate and which is parallel to [0001].

Figure 4B:
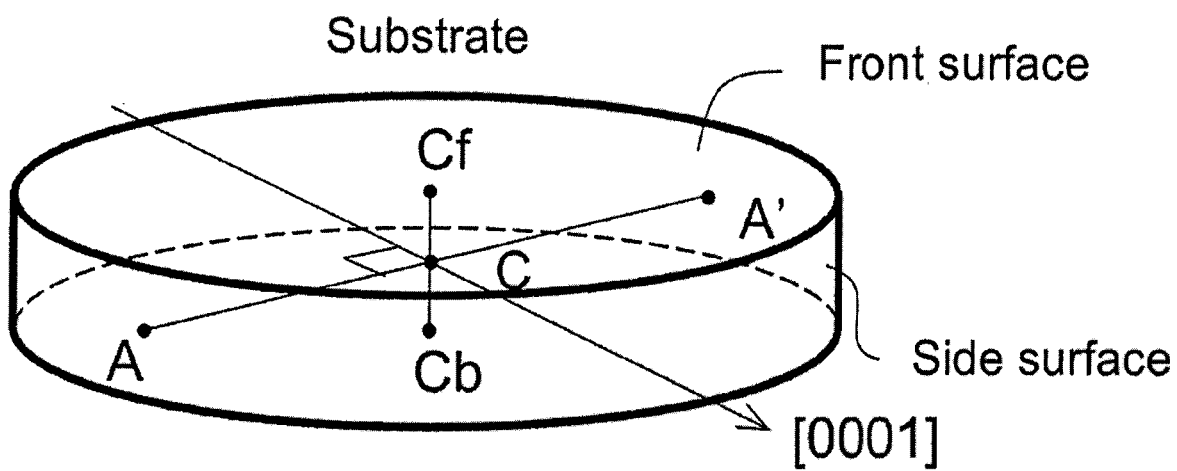

Furthermore, as illustrated in FIG. 4B, when a point A on the side surface of the substrate is the "first point", a point A' on the side surface of the substrate, positioned opposite the point A across the center C of the substrate, namely, a point where an extension of the straight line AC intersects the side surface of the substrate also corresponds to the "first point".

For example, when the tilt direction of the front surface relative to the (0001) plane is the <10-10> direction, the "first point" is a intersection point between the side surface of the substrate and a straight line being parallel to the a-axis and passing through the center of the substrate.

The GaN substrate of the present invention is characteristic in that a single diffraction peak is shown in an X-ray diffraction pattern obtained by θ scan in which an X-ray (CuK$\alpha_1$: wavelength: 0.1542 nm) is incident to the first point defined as above and the incident angle θ of the incident X-ray is varied while the 2θ angle of the diffracted X-ray is fixed to twice ($2\theta_{Bragg}$) the Bragg angle of 28.99° of the {11-20} plane.

The X-ray diffraction pattern obtained by θ scan means a pattern obtained by plotting the θ scan results on a coordinate plane where the horizontal axis represents the incident angle and the vertical axis represents the diffraction intensity. The pattern showing a single diffraction peak means that the crystal quality is good at the substrate edge containing the first point to such an extent that the orientation of the {11-20} plane can be identified by the θ scan.

The half-value width (full width at a half maximum) of the diffraction peak also serves as an index of the crystal quality at the substrate edge containing the first point. As the crystal quality is better, the half-value width is narrower. Therefore, the half-value width of the diffraction peak is preferably 0.5° or less, more preferably 0.4° or less, more preferably 0.3° or less, more preferably 0.2° or less.

Figure 5:
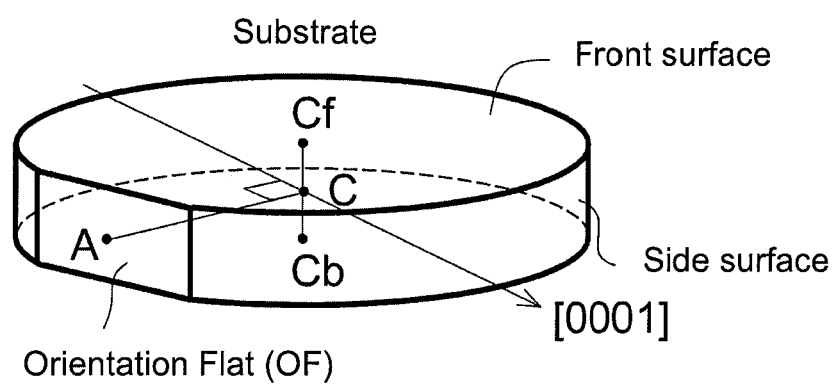
FIG. 5 is a perspective view of a disk-shaped GaN substrate having one of the first points on an orientation flat.

The GaN substrate of the present invention may have one of the first points on an orientation flat (OF) provided on the side surface of the substrate, as in an example illustrated in FIG. 5.

When the substrate is viewed from the front surface side, the outer circumference forms a straight line at a portion where the OF is provided. When the direction of the straight line is called a "OF direction", the GaN substrate having the first point on the OF preferably has high parallelism between the OF direction and the orthogonal projection of the c-axis on the front surface. The absolute value of the angle between the OF direction and the orthogonal projection of the c-axis on the front surface is preferably 1° or less, more preferably 0.5° or less, more preferably 0.2° or less.

When the nominal diameter of the GaN substrate is 2 inches (45 to 55 mm), the OF length is demanded to be less than 20 mm.

When the nominal diameter of the GaN substrate is 4 inches (95 to 105 mm), the OF length is demanded to be less than 40 mm.

When the nominal diameter of the GaN substrate is 6 inches (145 to 155 mm), the OF length is demanded to be less than 60 mm.

The GaN substrate of the present invention may be a substrate cut out from a bulk GaN crystal grown by use of a tiling method. A GaN substrate produced by such process usually has a characteristic structure where the GaN substrate has a plurality of single crystal regions each exposed on the front surface and the back surface.

Figure 6A:
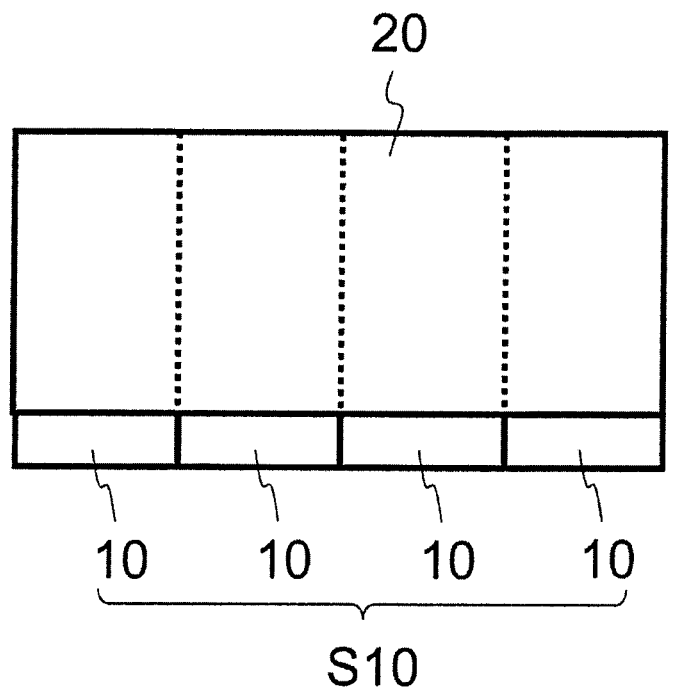
FIGS. 6A and 6B include cross-sectional views each illustrating a step of slicing GaN substrates from a bulk GaN crystal.

As described with reference to FIGS. 6A and 6B, when the tiling method is used, the bulk GaN crystal 20 grown on the main surface of the aggregate seed S10 comprises single crystal regions formed above respective tile seeds 10 and boundary regions which are each present at a boundary between the single crystal regions, as illustrated in FIG. 6A. In FIG. 6A, the boundary regions are indicated by dotted lines.

Figure 6B:
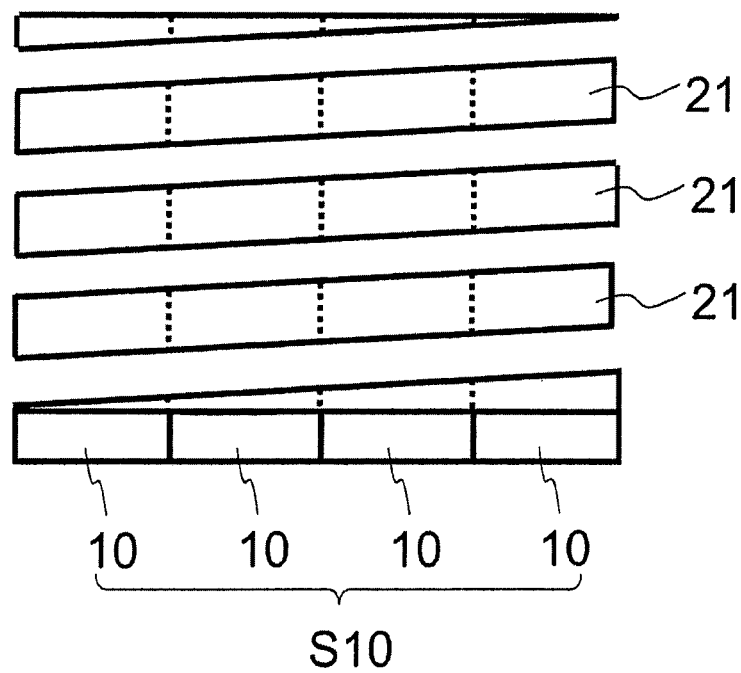

When the bulk GaN crystal 20 is sliced so that each of the boundary regions is divided, as illustrated in FIG. 6B, each of the single crystal regions and each of the boundary regions are exposed on the front surface and the back surface in the resulting GaN substrate 21.

The boundary regions have a higher crystal defect density than the single crystal regions, and therefore the positions of the boundary regions on the front surface of the GaN substrate 21 may be found by PL mapping. The reason is that PL (photoluminescence) intensity is relatively decreased in a region having a high dislocation density.

In most cases, adjacent single crystal regions are slightly different in crystal orientation to cause a discontinuity in crystal orientation at the boundary region therebetween, and therefore the boundary regions can be detected by X-ray topographic analysis.

Figure 7A:
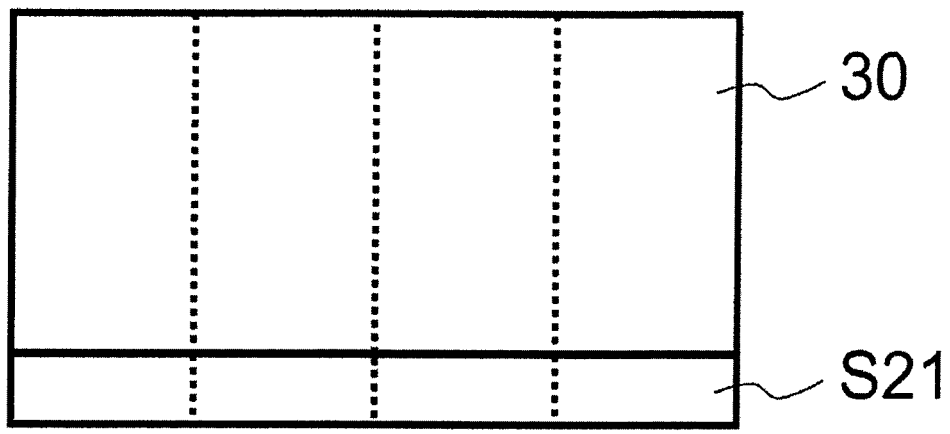
FIGS. 7A and 7B include cross-sectional views each illustrating a step of slicing GaN substrates from a bulk GaN crystal.

The substrate having a structure comprising a plurality of single crystal regions each exposed on the front surface and the back surface is not limited to the GaN substrate cut out from the bulk GaN crystal grown by use of the tiling method. As illustrated in FIG. 7A, when a bulk GaN crystal 30 is grown on amain surface of a seed substrate S21 having such structure, the bulk GaN crystal 30 also comprises single crystal regions and boundary regions which are each present at a boundary between the single crystal regions, because the structure of the seed substrate S21 is taken over. FIG. 7A indicates the boundary regions by dotted lines.

Figure 7B:
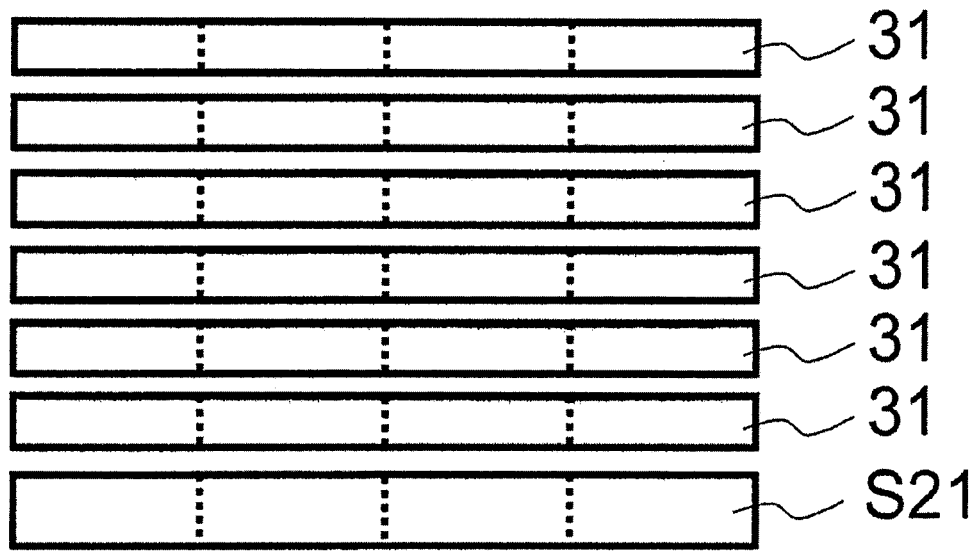

When the bulk GaN crystal 30 is sliced so that each of the boundary regions is divided, as illustrated in FIG. 7B, each of the single crystal regions and each of the boundary regions are exposed on the front surface and the back surface in the resulting GaN substrate 31.

When the GaN substrate of the present invention has a diameter of 45 to 80 mm (2 to 3 inches in nominal diameter), it is preferably configured by 1 to 4, more preferably 1 or 2 single crystal regions. When the GaN substrate having such size is configured by a plurality of single crystal regions, the plurality of single crystal regions are arranged in a row along the direction of the orthogonal projection of the c-axis on the front surface.

The plurality of single crystal regions being arranged along the the orthogonal projection direction of the c-axis means that, when any adjacent two are selected from the plurality of single crystal regions arranged, the angle in the front surface, formed by the boundary between the two single crystal regions and the orthogonal projection of the c-axis on the front surface, is in the range of 90°±10°.

Figure 15:
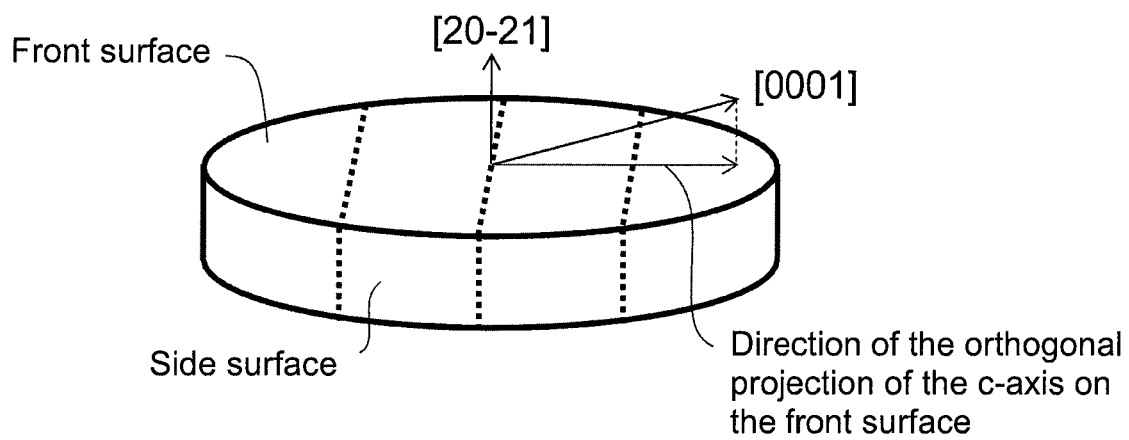
FIG. 15 is a perspective view of a GaN (20-21) substrate having a structure where four single crystal regions are arranged in a row along the direction of the orthogonal projection of the c-axis on the front surface.

FIG. 15 illustrates a perspective view of a GaN (20-21) substrate where four single crystal regions are arranged in a row along the direction of the orthogonal projection of the c-axis on the front surface.

When the GaN substrate of the present invention has a diameter of 95 to 105 mm (4 inches in nominal diameter), it may comprise a plurality of single crystal regions arranged in a row or two rows along the direction of the orthogonal projection of the c-axis on the front surface. In the case of two rows, when any adjacent two are selected from the plurality of single crystal regions contained in each of the rows, the angle in the front surface, formed by the boundary between the two single crystal regions and the orthogonal projection of the c-axis on the front surface, is in the range of 90°±10°.

When the plurality of single crystal regions contained in the GaN substrate having a diameter of 95 to 105 mm are arranged in a row along the direction of the orthogonal projection of the c-axis on the front surface, the number of the plurality of single crystal regions are preferably 2 to 8, more preferably 2 to 4.

When the plurality of single crystal regions contained in the GaN substrate having a diameter of 95 to 105 mm are arranged in two rows along the direction of the orthogonal projection of the c-axis on the front surface, the number of the single crystal regions included in each of the rows is preferably 2 to 8, more preferably 2 to 4. The number of the single crystal regions contained in one of the rows and the number of the single crystal regions contained in the other of the rows may be the same or different.

Figure 16:
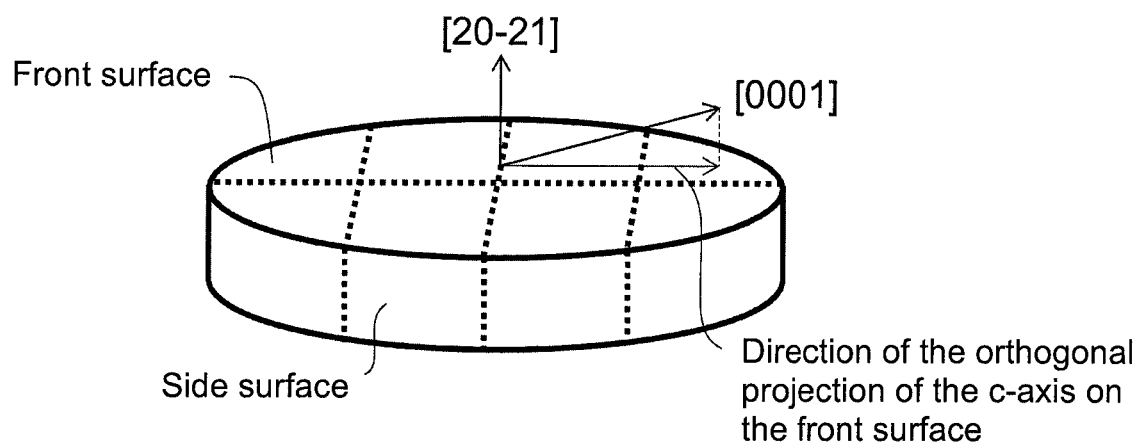
FIG. 16 is a perspective view of a GaN (20-21) substrate having a structure where eight single crystal regions are arranged in two rows in the direction of the orthogonal projection of the c-axis on the front surface.

FIG. 16 illustrates a perspective view of a GaN (20-21) substrate having a structure where eight single crystal regions are arranged in two rows along the direction of the orthogonal projection of the c-axis on the front surface. In this example, the number of the single crystal regions contained in each of the rows is 4.

When the GaN substrate of the present invention has a diameter of 145 to 155 mm (6 inches in nominal diameter), it may comprise a plurality of single crystal regions arranged in two rows or three rows along the direction of the orthogonal projection of the c-axis on the front surface. When any adjacent two are selected from the plurality of single crystal regions contained in each of the rows, the angle in the front surface, formed by the boundary between the two single crystal regions and the orthogonal projection of the c-axis on the front surface, is in the range of 90°±10°. The number of the single crystal regions contained in each of the rows is preferably 3 to 12, more preferably 3 to 6. The number of the single crystal regions contained in one of the rows and the number of the single crystal regions contained in another one of the rows may be the same or different.

2. Application of GaN Substrate

The GaN substrate of the present invention is used for production of a nitride semiconductor device.

Nitride semiconductors are also called "nitride-based Group III-V compound semiconductors", "Group III nitride-based compound semiconductors", "GaN-based semiconductors" or the like, and include, besides GaN (gallium nitride), a compound where Ga of GaN is partially or fully substituted with other Group 13 element (B, Al, In, or the like) in the periodic table. Examples include AlN, InN, AlGaN, AlInN, GaInN and AlGaInN.

The nitride semiconductor device can be produced by forming a device structure through vapor phase epitaxial growth of one or more nitride semiconductors on the GaN substrate of the present invention. As the epitaxial growth method, an MOCVD method, an MBE method, a pulsed vapor deposition method, and the like, which are suitable for formation of a thin film, may be preferably used.

Specific examples of the nitride semiconductor device include light-emitting devices such as a light-emitting diode and a laser diode, electronic devices such as a rectifier, a bipolar transistor, a field-effect transistor and a HEMT (High Electron Mobility Transistor), semiconductor sensors such as a temperature sensor, a pressure sensor, a radiation sensor and a visible-ultraviolet light detector, a SAW (Surface Acoustic Wave) device, a transducer, a resonator, an oscillator, MEMS (Micro Electro Mechanical System) components, a voltage actuator, and a solar cell.

3. Production Method of GaN substrate

The GaN substrate of the present invention may be produced by growing a bulk GaN crystal on a main surface of a seed, and processing the bulk GaN crystal.

Figure 8:
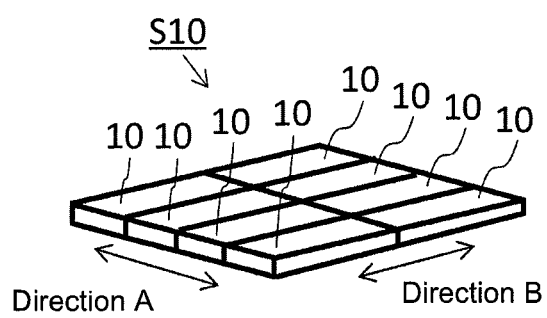
FIG. 8 is a perspective view illustrating a configuration example of an aggregate seed.

An aggregate seed configured by aggregating a plurality of tile seeds comprising a GaN crystal, or a GaN substrate is used as a seed. The aggregate seed may be a seed configured by tile seeds arranged in two different directions. For example, an aggregate seed S10 illustrated in FIG. 8 is configured by tile seeds 10 arranged in two directions of a direction A and a direction B.

The deviation between the surface orientation of the main surface of the seed and the surface orientation of the main surface (front surface or back surface) of the GaN substrate to be produced is preferably 10° or less, more preferably 7.5° or less, more preferably 5° or less, more preferably 2.5° or less. The deviation is most preferably substantially zero.

When the bulk GaN crystal is grown on the seed, a vapor phase growth method such as an HVPE method or an MOVPE method is used. The HVPE method is preferably used.

The size of the seed is determined in consideration of the size of the GaN substrate to be produced. The size of a seed means a size in a plane view, in other words, a size of its main surface.

The size of the seed in a direction perpendicular to the c-axis is particularly important. For example, when the main surface of the seed is tilted precisely in the <10-10> direction relative to the (0001) plane, the size of the seed in the direction perpendicular to the c-axis means the size in the a-axis direction.

In the following description, the "direction perpendicular to the c-axis" is abbreviated as the "⊥c direction" for convenience.

The reason why the size in the ⊥c direction is important among sizes of the seed is that the present inventors have found that the bulk GaN crystal grown on the seed contains a part unexpectedly low in crystal quality at the ⊥c direction edge. Herein, the ⊥c direction of a bulk GaN crystal refers to a direction perpendicular to the growth direction (thickness direction) of the bulk GaN crystal and orthogonal to the c-axis. When a bulk GaN crystal is grown on a seed, the growth direction thereof corresponds to a direction perpendicular to the main surface of the seed.

In order that the GaN substrate of the present invention is produced, the bulk GaN crystal is grown on the seed to which a margin in the ⊥c direction size is provided, and a portion of the bulk GaN crystal, from which the ⊥c direction edges are removed, is used to produce the GaN substrate.

Specifically, the seed size in the ⊥c direction is set to a size obtained by adding, to the diameter of the GaN substrate to be produced, preferably 8 mm or more, more preferably 10 mm or more, and more preferably 12 mm or more. A portion of the bulk GaN crystal grown on the seed, the portion being preferably apart from each of the ⊥c direction end by 4 mm or more, more preferably 5 mm or more, more preferably 6 mm or more, is used for production of the GaN substrate.

A known technology may be appropriately referenced with regard to a technique necessary for processing a bulk GaN crystal to produce a GaN substrate. A necessary processing such as coring, slicing, grinding, lapping, CMP, etching or beveling may be arbitrarily performed depending on the specification of a substrate to be demanded.

A processing for forming a part serving as an orientation flat (OF) may be performed in an ingot or wafer.

Figure 9:
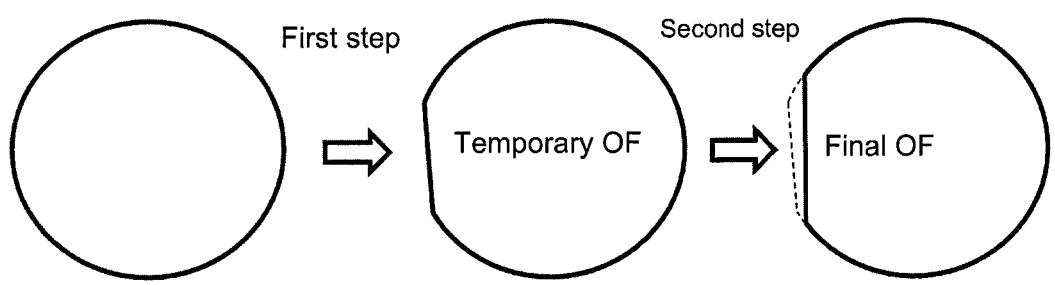
FIG. 9 includes plan views describing a method of forming an orientation flat in two steps.

An OF is formed preferably in the following two steps. In a first step, as illustrated in FIG. 9, a flat surface is formed as a temporary OF on a part of an ingot or wafer by grinding or sawing. Next, the orientation of this temporary OF is identified by an X-ray diffraction method. In a second step, a final OF having an orientation corrected based on the orientation of the temporary OF is formed on a part of the ingot or wafer by grinding or sawing.

Since a seed with no margin in the $\perp c$ direction size was used in the prior art, a bulk GaN crystal grown on such seed included in the $\perp c$ direction edges thereof a part remarkably low in crystal quality, and such part was inavoidably introduced in an ingot or wafer. Because of the part remarkably low in crystal quality contained in the edges of the ingot or wafer, when a temporary OF was formed, the orientation thereof was unable to be identified by an X-ray diffraction method, and as a result, it was unable to form an OF with high orientation accuracy.

On the contrary, in the course of production of the GaN substrate of the present invention, the low crystal quality part comprised in the $\perp c$ direction edges of the bulk GaN crystal grown on the seed is prevented from being contained in an ingot or wafer, and therefore an OF with high orientation accuracy can be formed by the above mentioned two-step processing.

Using a case of producing a disk-shaped GaN substrate with a diameter of 50 mm as an example, some preferred embodiments of the production method are shown below.

Embodiment 1

A single crystal substrate comprising a GaN crystal grown by an ammonothermal method is prepared as a seed. The seed consists of one single crystal region, and has a rectangular main surface with two sides parallel to the $\perp c$ direction and other two sides perpendicular to the $\perp c$ direction. The size of the main surface in the $\perp c$ direction is 58 mm or more, and the size thereof in a direction perpendicular to the $\perp c$ direction is 52 mm or more.

A bulk GaN crystal is grown on the main surface of the seed by an HVPE method, and a portion apart from the $\perp c$ direction ends by preferably 4 mm or more in the resulting bulk GaN crystal is processed to produce a GaN substrate.

The resulting GaN substrate is configured by one single crystal region.

Embodiment 2

Three single crystal substrates, each comprising a GaN crystal grown by an ammonothermal method, are prepared as seed substrates. Each thereof consists of one single crystal region, and has a rectangular main surface with two sides parallel to the $\perp c$ direction and other two sides perpendicular to the $\perp c$ direction. The size of the main surface of one of the three substrates is 52 mm in the $\perp c$ direction and 52 mm or more in a direction perpendicular to the $\perp c$ direction. The size of the main surface of each of the other two substrates is 5 to 10 mm in the $\perp c$ direction and 52 mm or more in a direction perpendicular to the $\perp c$ direction. The surface orientations of the main surfaces are the same among the three substrates.

Figure 17:
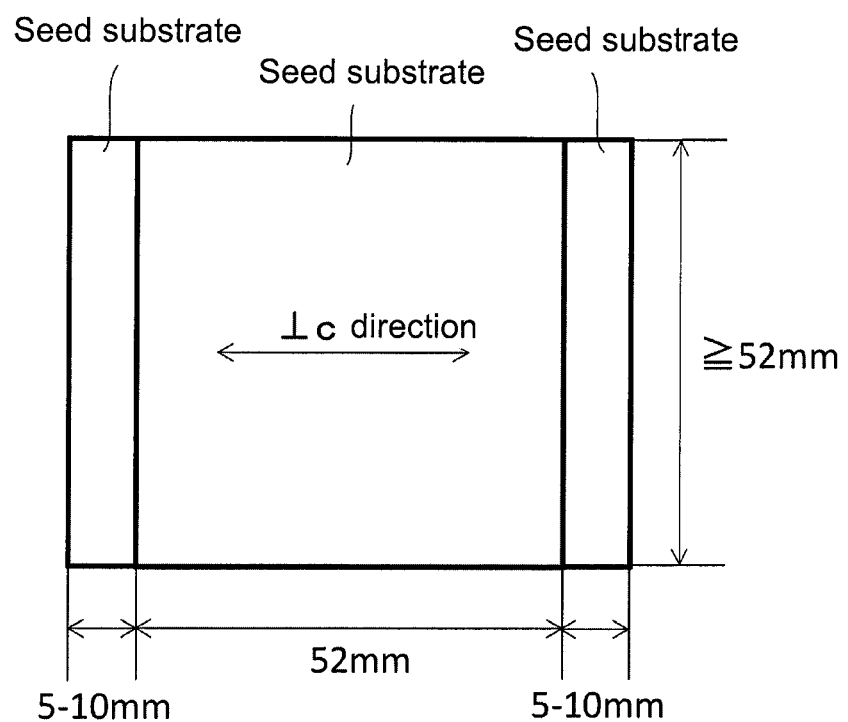
FIG. 17 is a plan view illustrating an example of an aggregate seed.

The three seed substrates (GaN single crystal substrates) are arranged in the $\perp c$ direction to form an aggregate seed as illustrated in FIG. 17. A bulk GaN crystal is grown on the aggregate seed by an HVPE method, and a portion of the resulting bulk GaN crystal, the portion being grown on the large single crystal substrate at the center, is processed to produce a GaN substrate.

The resulting GaN substrate is configured by one single crystal region.

Embodiment 3

Four single crystal substrates, each comprising a GaN crystal grown by an ammonothermal method, are prepared. Each thereof consists of one single crystal region, and has a rectangular main surface with two sides parallel to the $\perp c$ direction and other two sides perpendicular to the $\perp c$ direction. The size of the main surface of each of the four single crystal substrates is 58 mm or more in the $\perp c$ direction and 15 mm in a direction perpendicular to the $\perp c$ direction. The surface orientations of the main surfaces are the same among the four substrates.

The four single crystal substrates (tile seeds) are arranged in the direction of the orthogonal projection of the c-axis on their main surfaces, to form an aggregate seed, and a bulk GaN crystal is grown on the aggregate seed by an HVPE method. A portion apart from the $\perp c$ direction ends by preferably 4 mm or more in the resulting bulk GaN crystal is processed to produce a GaN substrate.

The resulting GaN substrate contains four single crystal regions arranged in a row along the direction of the orthogonal projection of the c-axis on the front surface.

Embodiment 4

The bulk GaN crystal grown on the aggregate seed in Embodiment 3 is sliced to produce a seed substrate having a substantially rectangular main surface with two sides substantially parallel to the $\perp c$ direction and other two sides substantially perpendicular to the $\perp c$ direction. The size of the main surface of the seed substrate is 58 mm or more in the $\perp c$ direction and 60 mm in a direction perpendicular to the $\perp c$ direction. The seed substrate is produced from the GaN crystal grown on the aggregate seed, and therefore comprises four single crystal regions arranged in the direction of the orthogonal projection of the c-axis on its main surface.

A bulk GaN crystal is grown on the main surface of the seed substrate by an HVPE method, and a portion apart from the $\perp c$ direction ends by preferably 4 mm or more in the resulting bulk GaN crystal is processed to produce a GaN substrate.

The resulting GaN substrate contains four single crystal regions arranged in a row along the direction of the orthogonal projection of the c-axis on the front surface.

Embodiment 5

The bulk GaN crystal grown on the aggregate seed in Embodiment 3 is processed to prepare three seed substrates. Each of the three seed substrates has a rectangular main surface with two sides parallel to the $\perp c$ direction and other two sides perpendicular to the $\perp c$ direction. The size of the main surface of one of the three seed substrates is 52 mm in the $\perp c$ direction and about 60 mm in a direction perpendicular to the $\perp c$ direction. The size of the main surface of each of the other two seed substrates is 5 to 10 mm in the $\perp c$ direction and about 60 mm in a direction perpendicular to the $\perp c$ direction. The plane orientations of the main surfaces are the same among the three seed substrates. Because of being produced from the GaN crystal grown on the same aggregate seed, each of the three seed substrates comprises four single crystal regions arranged in the direction of the orthogonal projection of the c-axis on the main surface.

Figure 18:
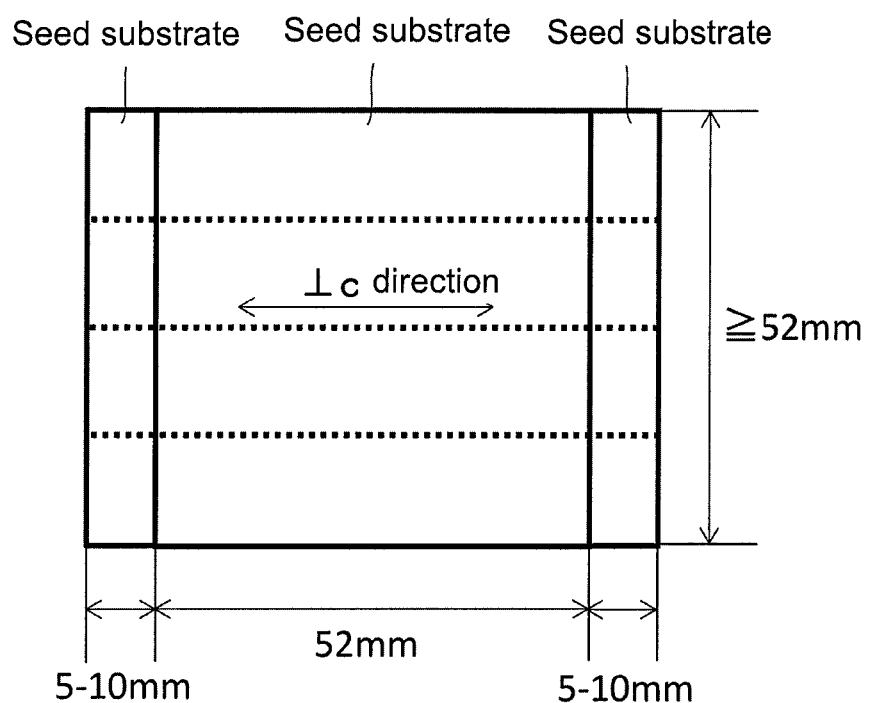
FIG. 18 is a plan view illustrating an example of an aggregate seed.

The three seed substrates are arranged as illustrated in FIG. 18, to form an aggregate seed. A bulk GaN crystal is grown on the aggregate seed by an HVPE method, and a portion of the resulting bulk GaN crystal, the portion being grown on the large seed substrate at the center, is processed to produce a GaN substrate.

The resulting GaN substrate comprises four single crystal regions arranged in a row along the direction of the orthogonal projection of the c-axis on the front surface.

4. Experimental Results

Hereinafter, the results of experiments performed by the present inventors are described.

4.1. Production of M-Plane GaN Substrate (Part 1)

An M-plane GaN substrate was produced by a procedure described below. The M-plane GaN substrate produced was a disk-shaped substrate having a diameter of 50 mm.

[1] Production of Tile Seed

A GaN template obtained by epitaxially growing a GaN film by an MOVPE method on a C-plane sapphire substrate surface was prepared. A c-axis oriented bulk GaN crystal was grown thereon by an HVPE method. The bulk GaN crystal was sliced to produce a C-plane GaN substrate. For using as an underlying surface for epitaxial growth in the next step, the nitrogen polar surface of the C-plane GaN substrate was planarized by lapping and CMP.

A growth mask of a stripe pattern having a line-shaped opening of 100 μm width was formed with a TiW alloy on the nitrogen polar surface of the C-plane GaN substrate produced. The longitudinal direction of the opening, namely, the stripe direction was parallel to the a-axis of GaN. A GaN crystal was grown by an ammonothermal method on the nitrogen polar surface of the C-plane GaN substrate with the mask pattern formed thereon.

Polycrystalline GaN was used as a feedstock, and ammonium fluoride ($NH_4F$) and hydrogen iodide (HI) were used as mineralizers. The charged amounts of $NH_4F$ and HI were determined so that the molar ratio of fluorine atoms to $NH_3$ was 0.5 to 1.5%, the molar ratio of iodine atoms to $NH_3$ was 1.5 to 3.5% and the molar ratio of fluorine atoms to iodine atoms was 0.2 to 0.5.

The growth conditions were set as follows: the average temperature in a growth vessel (the average value of the temperatures in a crystal growth zone and a feedstock dissolution zone) was 590 to 630° C., the difference in temperatures between the crystal growth zone and the feedstock dissolution zone was 5 to 20° C. and the pressure in the growth vessel was 200 to 220 MPa.

The C-plane GaN substrate with the growth mask provided on the nitrogen polar surface was placed in the growth vessel and subjected to crystal growth under the above conditions for 100 days in total (when the feedstock was consumed on the way of the growth, the growth vessel was exchanged and regrowth was carried out), and thereby a plate-shaped GaN crystal whose thickness direction being the m-axis direction was obtained. The plate-shaped GaN crystal had a dimension of at most 20 mm in the c-axis direction.

The outer shape of the plate-shaped GaN crystal was trimmed, and both of its main surfaces were planarized and subjected to CMP finishing, to thereby produce an M-plane GaN substrate having rectangular main surfaces.

Next, the M-plane GaN substrate was used as a seed to again grow a GaN crystal by an ammonothermal method. In the second ammonothermal growth, charged amounts of $NH_4F$ and HI were set so that the molar ratios of fluorine atoms and iodine atoms to $NH_3$ were 0.5% and 1.5%, respectively, and the average temperature in the growth vessel was 600 to 611° C., the difference in temperatures between the crystal growth zone and the feedstock dissolution zone was 9 to 13° C. and the pressure in the growth vessel was 200 to 220 MPa.

Figure 10:
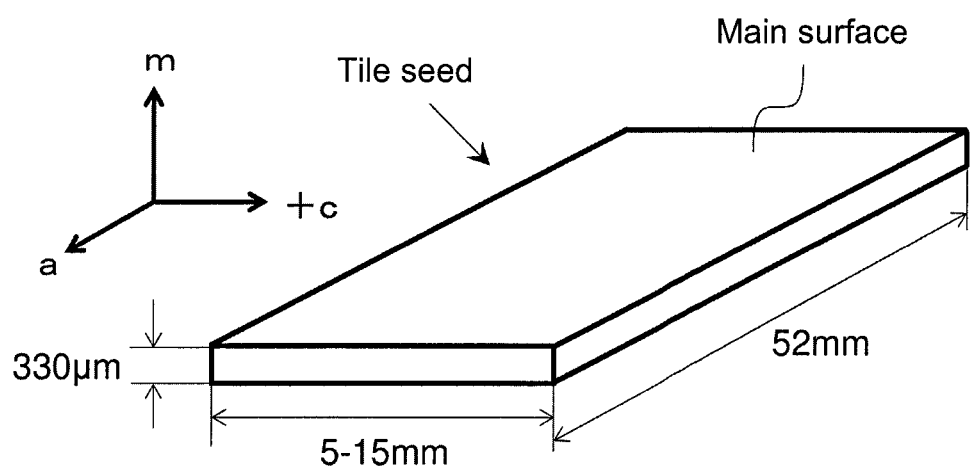
FIG. 10 is a perspective view illustrating an example of a tile seed.

The bulk GaN crystal obtained in the second ammonothermal growth was sliced to obtain a plate-shaped GaN crystal piece, and the outer circumference of the GaN crystal piece was cut with a dicing saw to thereby produce a tile seed having a rectangular main surface as illustrated in FIG. 10.

The orientation of the main surface of the tile seed was M-plane, and the longer sides of the main surface were parallel to the a-axis and the shorter sides thereof were parallel to the c-axis.

The sizes of the tile seed in the a-axis direction, the c-axis direction and the m-axis direction were 52 mm, 5 to 15 mm and about 330 μm, respectively.

The front surface of the tile seed was planarized by lapping and CMP.

[2] Production of Seed Substrate

The tile seeds produced in [1] above were arranged in a row along the c-axis direction on a susceptor of an HVPE apparatus, to form an aggregate seed. Such arrangement was made so that, between any adjacent tile seeds, the side surface on the [0001] side of one was in contact with the side surface on the [000-1] side of the other.

Next, gallium chloride and ammonia were fed onto the aggregate seed using nitrogen gas as a carrier gas, to grow a GaN crystal by 5 mm in the m-axis direction at a growth temperature of 1050° C.

Next, the bulk GaN crystal grown on the aggregate seed was processed to produce a rectangular M-plane GaN substrate having a square main surface with two sides parallel to the a-axis and other two sides parallel to the c-axis. The sizes of the substrate in the a-axis direction and the c-axis direction were each 52 mm, and the thickness of the substrate was 300 μm.

In the next step, the rectangular M-plane GaN substrate was used as a seed substrate, to grow another bulk GaN crystal.

[3] Production of Disk-Shaped GaN Substrate

The rectangular M-plane GaN substrate produced in [2] above was used for a seed substrate to again grow a bulk GaN crystal by an HVPE method. The growth conditions were the same as those used in the previous growth of the GaN crystal on the aggregate seed.

The resulting bulk GaN crystal was processed to produce a disk-shaped M-plane GaN substrate having a diameter of 50 mm and thickness of about 300 μm.

Specifically, the outer circumference of the bulk GaN crystal was processed to provide a cylindrical ingot, and the ingot was then sliced parallel to the M-plane, to provide a disk-shaped wafer having a diameter of 50 mm.

Next, a portion was cut out from the a-axis direction (=⊥c direction) edge of the wafer using a rotary blade, to form an orientation flat (OF). The detail of the OF forming step is described later.

Next, a damaged layer on the wafer surface was removed by etching, and one main surface was further subjected sequentially to grinding, lapping and CMP, to complete the M-plane GaN substrate.

4.2. Step of Forming Orientation Flat

When forming a orientation flat (OF) on the wafer in 4.1.[3] above, the following was going to be performed: a portion of the outer peripheral part of the wafer was shallowly cut out to form a temporary OF in a first step, the orientation of the temporary OF was then examined by X-ray diffraction, and a final OF where the orientation was corrected by using the temporary OF orientation as a reference was formed in a subsequent second step, as illustrated in FIG. 9.

However, it was unable to identify the temporary OF orientation by X-ray diffraction in fact, and therefore the final OF with high orientation accuracy could not be formed.

Specifically, the temporary OF was formed in the first step, and θ scan was then performed, with an X-ray (CuKα$_1$: wavelength: 0.1542 nm) incident to the temporary OF surface so that the incident direction was parallel to the main surface of the wafer, and varying the incident angle θ of the incident X-ray while fixing the 2θ angle of the diffracted X-ray to twice the Bragg angle of 28.99° of the {11-20} plane. The results of the θ scan were plotted on a coordinate plane where the horizontal axis represented the incident angle and the vertical axis represented the diffraction intensity. No peak, however, appeared in the resulting X-ray diffraction pattern at all, and therefore the orientation of the temporary OF could not be identified.

4.3. Verification Experiment

As described in 4.2. above, no X-ray diffraction peak of the {11-20} plane was obtained on the temporary OF surface. The present inventors built up a hypothesis which assumes that the reason for this is that the bulk GaN crystal grown in 4.1. [3] above contained a low crystal quality part at the ⊥c direction edge and the temporary OF was formed on the low crystal quality part.

In order to verify this hypothesis, the present inventors performed the following experiment.

[1] Production of Test Piece

A rectangular M-plane GaN substrate having a main surface size of 52 mm×52 mm was produced by the same procedure as in 4.1.[1] to [2] above. Next, gallium chloride and ammonia were supplied to the rectangular M-plane GaN substrate by using nitrogen gas as a carrier gas to grow a GaN crystal at a growth temperature of 1050° C., thereby providing a bulk GaN crystal having the same quality as that used as the material of the disk-shaped GaN substrate in 4.1.[3] above.

In this experiment, the bulk GaN crystal was sliced parallel to the M-plane, to produce a plate-shaped test piece having a thickness of about 300 μm. The size of the test piece in the a-axis direction (=⊥c direction) was 55 mm. The side surface located at the a-axis direction edge of the test piece (the side surface positioned in the ⊥c direction when viewed from the center of the test piece) was an as-grown surface.

[2] Evaluation

First, it was examined whether an X-ray diffraction peak of the {11-20} plane was obtained when an X-ray was incident to the side surface located at the a-axis direction edge of the test piece. An "automatic X-ray crystal orientation measuring apparatus FSAS III" manufactured by Rigaku Corporation was used for the measurements.

Specifically, θ scan was performed, with an X-ray (CuKα$_1$: wavelength: 0.1542 nm) incident to the side surface of the test piece so that the incident direction was parallel to the main surface of the test piece, and varying the incident angle θ of the incident X-ray while fixing the 2θ angle of the diffracted X-ray to twice the Bragg angle of 28.99° of the {11-20} plane. The scan was performed within a range of ±5° around the angle at which the incident angle was substantially the Bragg angle.

The results of the θ scan were plotted on a coordinate plane where the horizontal axis represented the incident angle and the vertical axis represented the diffraction intensity, to provide an X-ray diffraction pattern.

Figure 11:
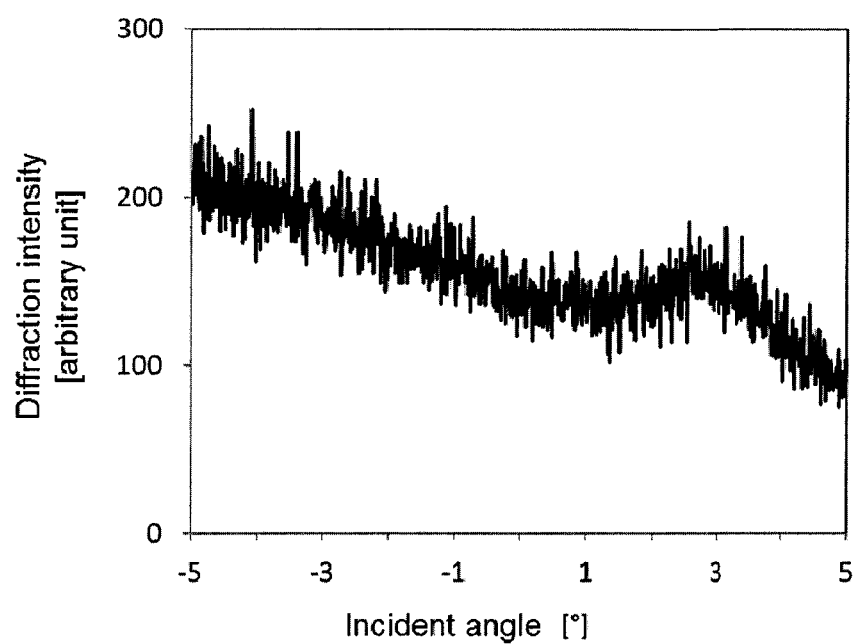
FIG. 11 illustrates an X-ray diffraction pattern.

The resulting X-ray diffraction pattern is illustrated in FIG. 11. In the horizontal axis in FIG. 11, the point at which the incident angle was substantially the Bragg angle is defined as the original point (0°).

No diffraction peak appeared in the X-ray diffraction pattern illustrated in FIG. 11 at all, indicating that the crystal quality was low. It is noted that a peak-like shape found in the range from θ=1° to θ=4° in the X-ray diffraction pattern in FIG. 11 also appeared at the same position in an X-ray diffraction pattern obtained when inverting the scanning direction by 180° and the peak-like shape was therefore confirmed not to be a diffraction peak.

Figure 12:
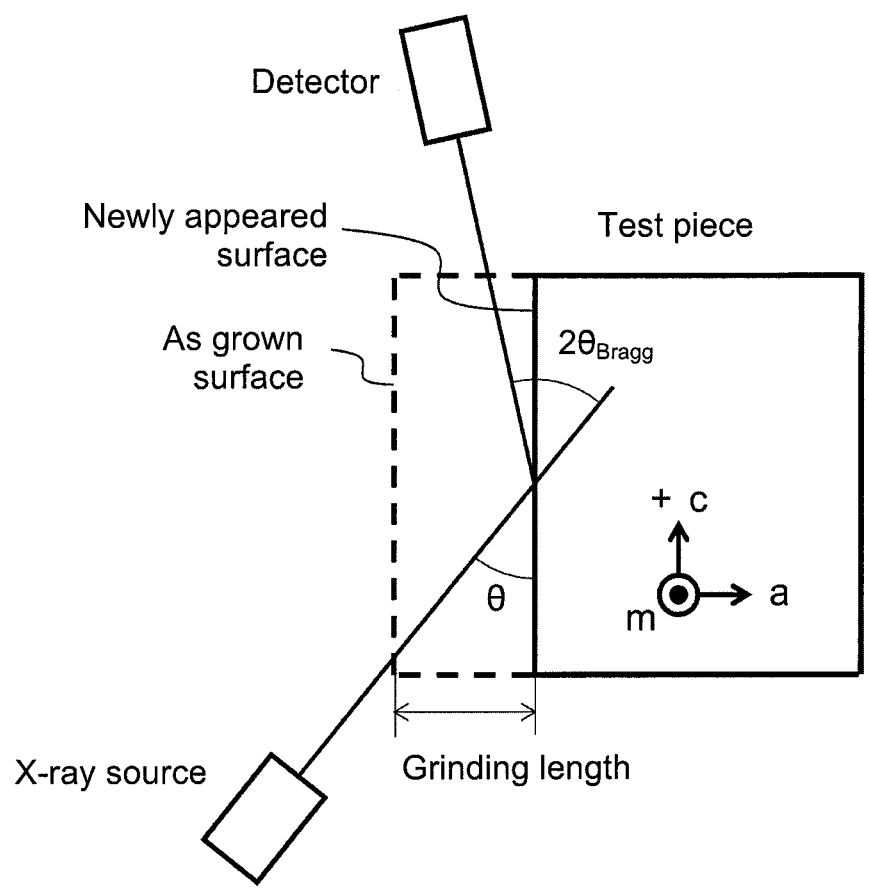
FIG. 12 illustrates a diagram describing an X-ray diffraction measurement method.

Next, as illustrated in FIG. 12, the a-axis direction edge of the test piece was ground and thus removed, the X-ray was incident to the newly appeared surface, and the same θ scan measurement as above was performed to provide an X-ray diffraction pattern.

As a result, when the grinding length was 3 mm, no diffraction peak was observed in the X-ray diffraction pattern also on the newly appeared surface, as on the as-grown surface, but when the grinding length was 4 mm, only one diffraction peak having a half-value width of 0.64° and having a shoulder appeared in the X-ray diffraction pattern.

Figure 13:
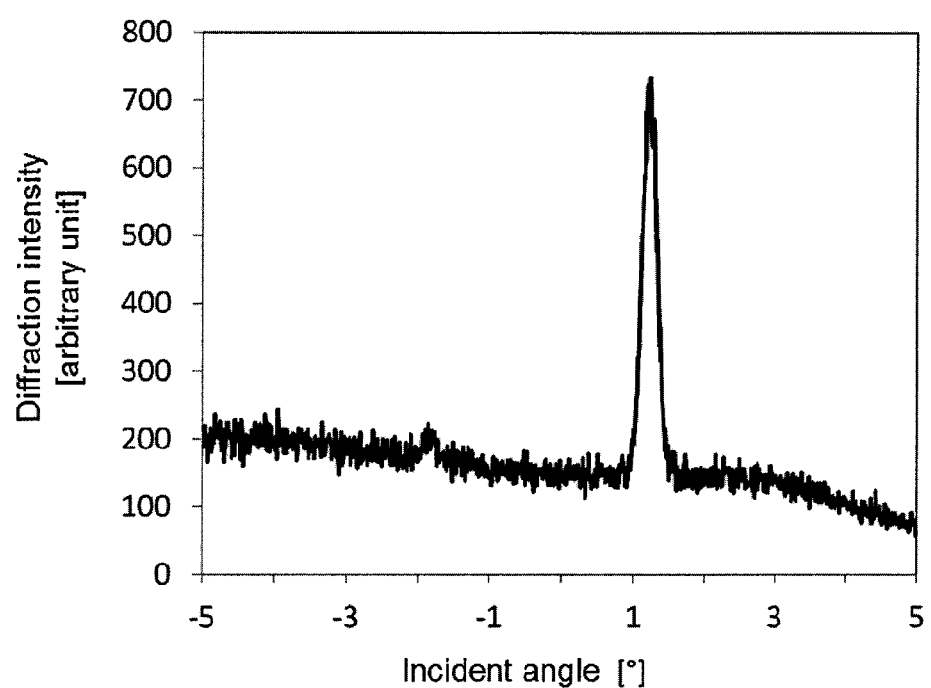
FIG. 13 illustrates an X-ray diffraction pattern.

Furthermore, when the grinding length was 5 mm, only one sharp diffraction peak having a half-value width of 0.29° appeared in the X-ray diffraction pattern, as illustrated in FIG. 13.

There was a variation in the experimental results, and a certain test piece showed no diffraction peak in the X-ray diffraction pattern until the grinding length exceeded 6 mm.

The half-value width of the diffraction peak tended to decrease along with the grinding length and thereafter converged to a constant value.

It was considered from the results that, in accordance with the hypothesis, a part remarkably low in crystal quality was comprised in the bulk GaN crystal grown in 4.1. [3] at the a-axis direction (=⊥c direction) edge, specifically in the portion 6 mm or less apart from the a-axis direction end.

[3] Conclusion

It can be seen from the results of this verification experiment that, when an OF is provided at the ⊥c direction edge of an M-plane GaN substrate, a temporary OF may be formed at a position apart from the ⊥c direction end of a bulk GaN crystal serving as a starting material, by a distance of preferably 4 mm or more, more preferably 5 mm or more, more preferably 6 mm or more.

The orientation of the temporary OF formed at such position can be identified by X-ray diffraction, and therefore the final OF with high orientation accuracy can be formed by using the temporary OF orientation as a reference. The final OF orientation can also be accurately evaluated by X-ray diffraction.

It is here to be noted that there can be a case where the OF length exceeds the tolerance if no margin is provided to the ⊥c direction size of the bulk GaN crystal. For example, when an M-plane GaN substrate having a diameter of 50 mm is to be obtained from a bulk GaN crystal having a ⊥c direction size of 50 mm, the temporary OF length becomes 27 mm when it is formed at a position 4 mm apart from the ⊥c direction end of the bulk GaN crystal. The length of the final OF formed by utilizing the temporary OF becomes 27 mm or more, and exceeds the upper limit of the OF length acceptable for a substrate a having a diameter of 2 inches (about 5 cm), which is 20 mm.

The findings obtained from the verification experiment is useful not only for improving orientation accuracy of OF provided at the ⊥c direction edge of an M-plane GaN substrate, but also for providing a non-polar or semi-polar GaN substrate not including a part remarkably decreased in crystal quality at the ⊥c direction edge, for the first time.

Figure 14:
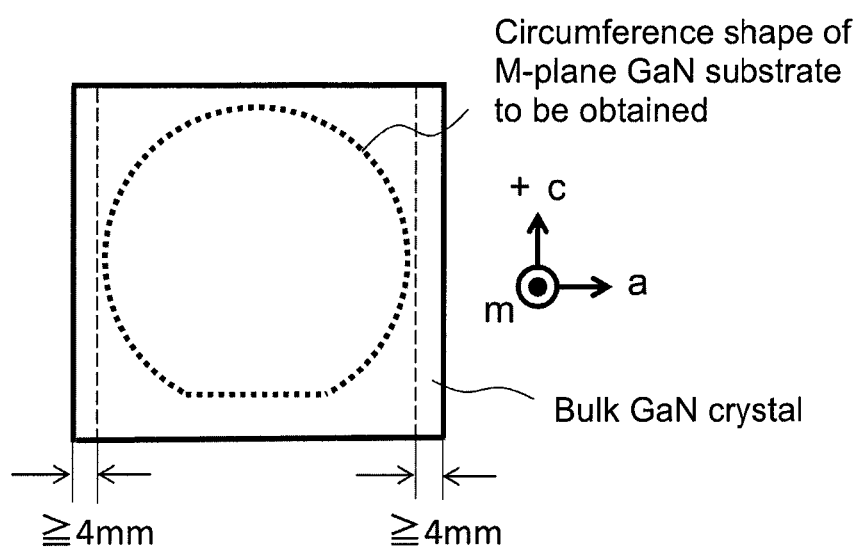
FIG. 14 is a plan view of a bulk GaN crystal where a margin is provided to the size in a direction perpendicular to the c-axis.

Specifically, as illustrated in FIG. 14, a bulk GaN crystal is grown, the crystal having the ⊥c direction size larger than the diameter of a GaN substrate to be obtained by preferably 8 mm or more, more preferably 10 mm or more, more preferably 12 mm or more. Only a portion of the bulk GaN crystal apart from each of the ⊥c direction ends by preferably 4 mm or more, more preferably 5 mm or more, more preferably 6 mm or more (a portion sandwiched between two dotted lines in FIG. 14) is used to produce a GaN substrate. Thus, the resulting GaN substrate does not have a part remarkably low in crystal quality at any ⊥c direction edge.

In order to grow such bulk GaN crystal at a high yield, it is considered that a seed may be used in which the ⊥c direction size of the main surface is larger than the diameter of a GaN substrate to be obtained, by preferably 8 mm or more, more preferably 10 mm or more, more preferably 12 mm or more.

4.4. Production of M-Plane GaN Substrate (Part 2)

The same procedure as described in 4.1. [1] above was performed to produce a tile seed having a rectangular main surface parallel to the M-plane and having longer sides parallel to the a-axis and shorter sides parallel to the c-axis.

The tile seeds were arranged in a row along the c-axis direction on the susceptor of the HVPE apparatus, to form an aggregate seed, and a bulk GaN crystal was grown thereon by an HVPE method.

The bulk GaN crystal grown was processed to produce a rectangular M-plane GaN substrate having a square main surface with two sides parallel to the a-axis and the other two sides parallel to the c-axis. The size of the substrate in the a-axis direction was 57.2 mm.

Next, the rectangular M-plane GaN substrate was used for a seed substrate to grow another bulk GaN crystal, and the another bulk GaN crystal was processed to produce another rectangular M-plane GaN substrate having a square main surface with two sides parallel to the a-axis and the other two sides parallel to the c-axis. The size of the substrate in the a-axis direction was 55.1 mm.

Furthermore, the another rectangular M-plane GaN substrate was used as a seed substrate to grow a bulk GaN crystal. The size of the bulk GaN crystal in the a-axis direction was 55.5 mm.

Figure 19A:
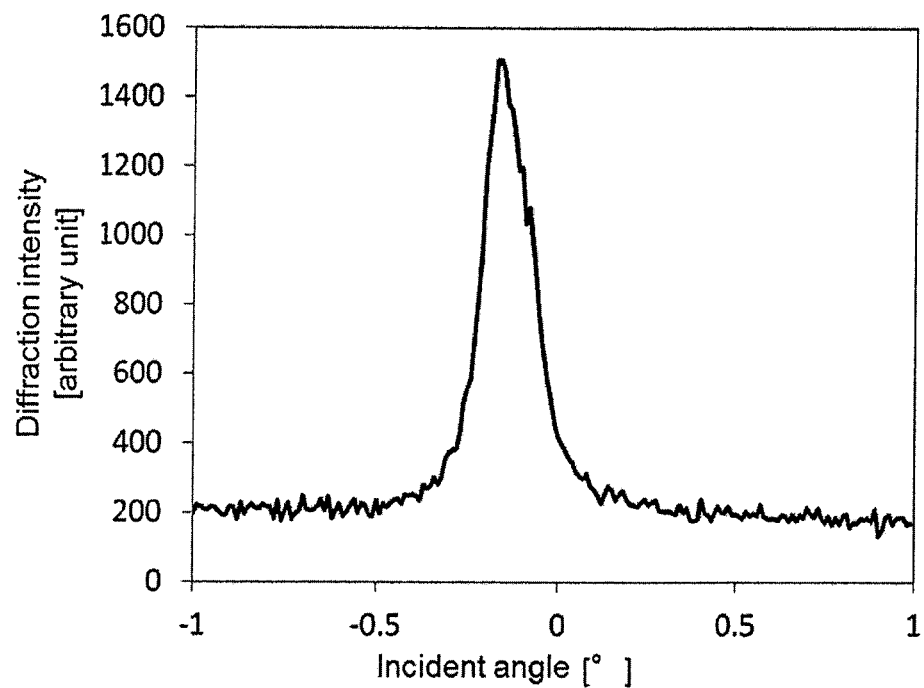
FIG. 19A and FIG. 19B each illustrate an X-ray diffraction pattern.
Figure 19B:
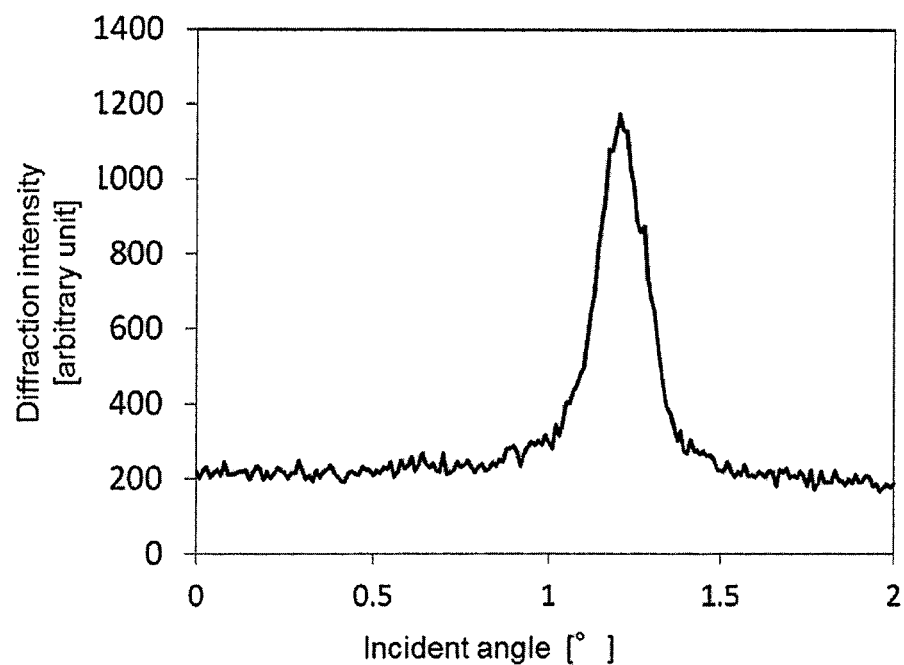

Only a portion apart from each of the a-axis direction ends by 7 mm or more in the bulk GaN crystal was used to produce a disk-shaped M-plane GaN substrate having a diameter of 40 mm.

θ scan was made, with an X-ray (CuKα$_1$: wavelength: 0.1542 nm) incident to a point on the side surface of the M-plane GaN substrate produced, the point being positioned in the a-axis direction (=⊥c direction) when viewed from the center of the substrate, so that the incident direction was parallel to the main surface, and varying the incident angle θ of the incident X-ray while fixing the 2θ angle of the diffracted X-ray to twice the Bragg angle of 28.99° of the {11-20} plane. FIGS. 19A and 19B each illustrate an X-ray diffraction pattern obtained from the θ scan performed at each of the two points facing each other across the center of the substrate. As can be seen from FIGS. 19A and 19B, a single diffraction peak was observed in the X-ray diffraction pattern obtained from the measurement at each of the points, and the half-value width thereof was 0.15°.

4.5. Reference Experiment

A tile seed having a rectangular main surface parallel to the M-plane with longer sides parallel to the a-axis and shorter sides parallel to the c-axis, was produced by the same procedure as described in 4.1. [1] above except that the size of the C-plane GaN substrate initially produced was increased. The a-axis direction size of the main surface of the resulting tile seed was 60 mm.

The tile seeds were arranged in a row along the c-axis direction on the susceptor of the HVPE apparatus, to form an aggregate seed, and gallium chloride and ammonia were supplied to the aggregate seed by using nitrogen gas as a carrier gas, to grow a bulk GaN crystal at a growth temperature of 1050° C. The resulting bulk GaN crystal had a thickness of about 5 mm, and the sizes thereof in the a-axis direction and in the c-axis direction were 62 mm and more than 52 mm, respectively.

Figure 20:
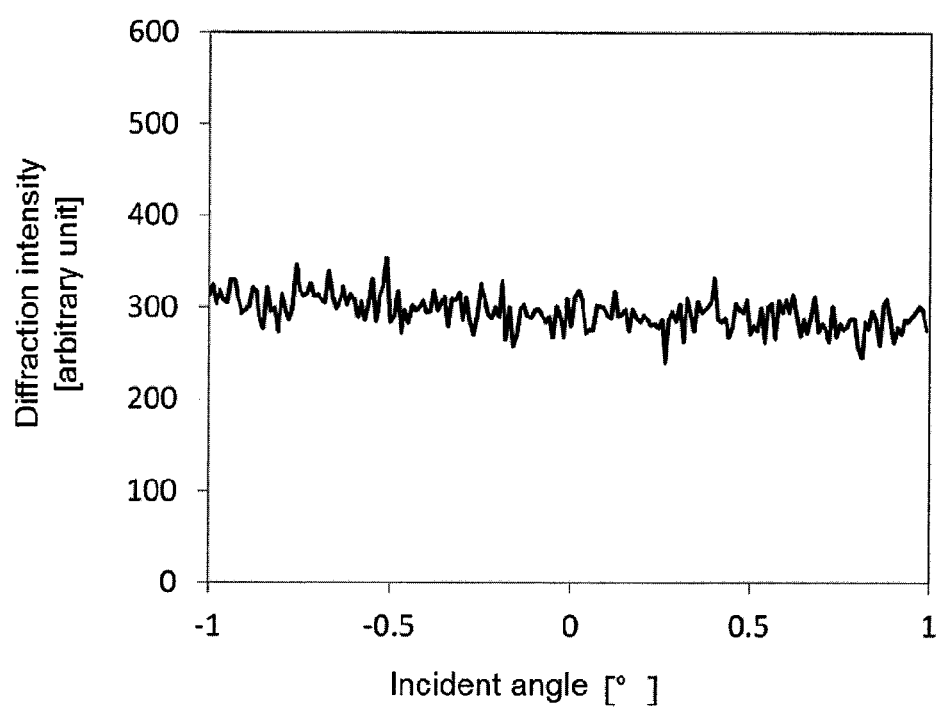
FIG. 20 illustrates an X-ray diffraction pattern.

The bulk GaN crystal was sliced to provide an M-plane GaN wafer having a front surface tilted from the M-plane in the [000-1] direction, by 5°. The main surface of the M-plane GaN wafer was substantially rectangular, and the side surface thereof was an as-grown surface.

θ scan was made, with an X-ray (CuKα$_1$: wavelength: 0.1542 nm) incident to the side surface located at one a-axis direction (=⊥c direction) edge of the M-plane GaN wafer so that the incident plane was parallel to the main surfaces, and varying the incident angle θ of the incident X-ray while fixing the 2θ angle of the diffracted X-ray to twice the Bragg angle of 28.99° of the {11-20} plane. FIG. 20 illustrates an X-ray diffraction pattern obtained from the θ scan.

As illustrated in FIG. 20, a diffraction peak could not be found in the resulting X-ray diffraction pattern. No diffraction peak appeared also in an X-ray diffraction pattern obtained from the same measurement performed on the side surface at the other a-axis direction edge of the M-plane GaN wafer.

Figure 21A:
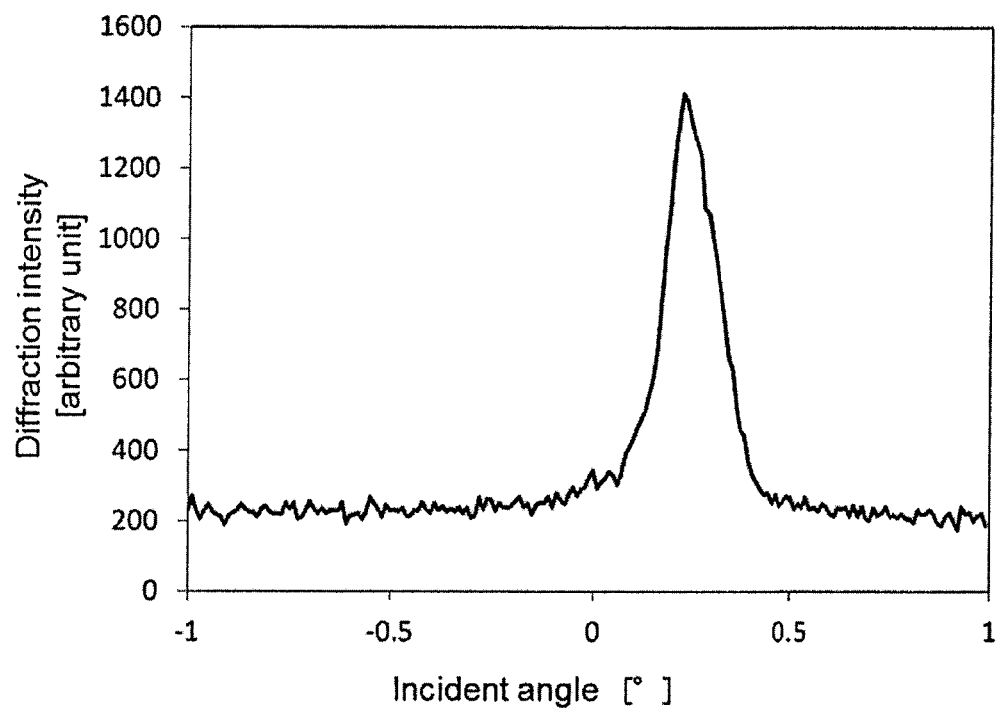
FIG. 21A and FIG. 21B each illustrate an X-ray diffraction pattern.
Figure 21B:
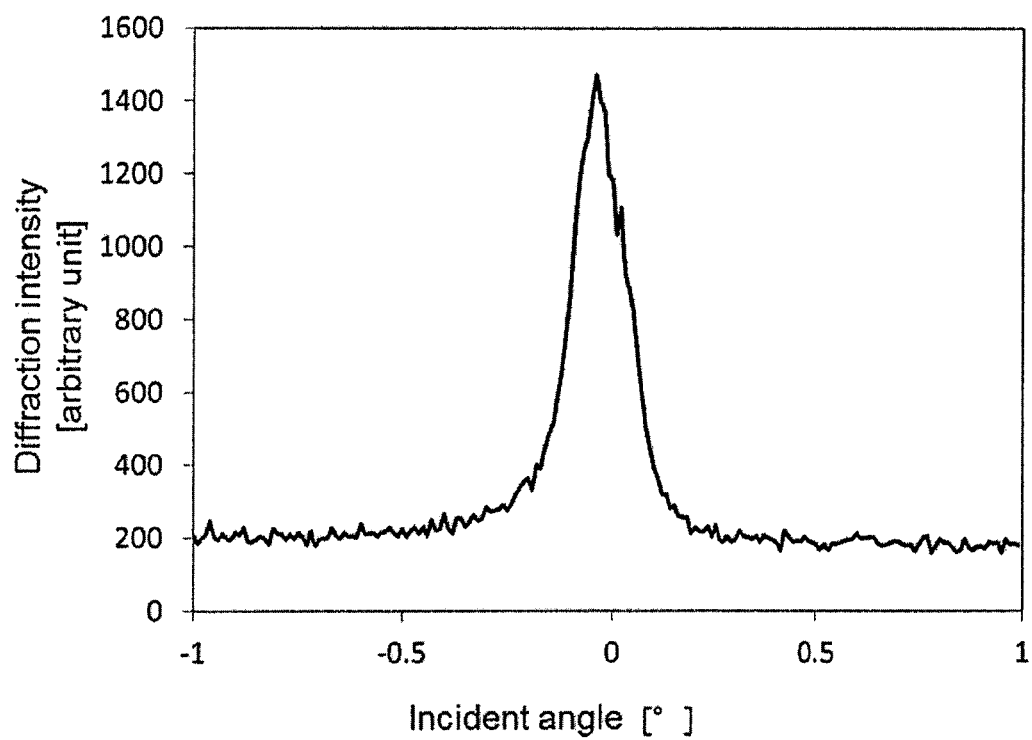

Next, a portion within 4 mm from the end was cut out using a dicing saw at each of the a-axis direction edges of the M-plane GaN wafer, to form a new side surface at a position apart from the as-grown surface by 4 mm.

θ scan was made, with an X-ray (CuKα$_1$: wavelength: 0.1542 nm) incident to the newly formed side surface, so that the incident plane was parallel to the main surface of the M-plane GaN wafer, and varying the incident angle θ of the incident X-ray while fixing the 2θ angle of the diffracted X-ray to the Bragg angle of 28.99° of the {11-20} plane. FIGS. 21A and 21B each illustrate an X-ray diffraction pattern obtained from the θ scan on each of the newly formed side surfaces mentioned above.

As can be seen from FIGS. 21A and 21B, a single diffraction peak was observed in the X-ray diffraction pattern obtained from measurements on each of the side surfaces, and the half-value width thereof was 0.16°.

The results indicate that a disk-shaped substrate with a diameter of 54 mm can be cut out from the bulk GaN crystal, the substrate not having a part remarkably decreased in crystallinity at any edge in a direction perpendicular to the c-axis.

Although the present invention is specifically described above with reference to embodiments, the respective embodiments are presented as examples and are not intended to limit the scope of the present invention. The respective embodiments described herein can be variously modified within the scope not departing from the gist of the present invention, and can be combined with any feature described in other embodiments within the scope of enablement.

REFERENCE SIGNS LIST 10 tile seed
S10 aggregate seed
20 bulk GaN crystal
21 GaN substrate
S21 seed substrate
30 bulk GaN crystal
31 GaN substrate

The invention claimed is:

1. A disk-shaped GaN substrate comprising:
a front surface tilted with a tilt angle of 45° or more and 135° or less relative to the (0001) plane in a tilt direction within a range of ±5° around the <10-10> direction; and
a back surface which is a main surface opposite to the front surface, wherein
the GaN substrate has a diameter of 45 mm or more and 80 mm or less,
the GaN substrate has one single crystal region or a plurality of single crystal regions arranged in a row along the direction of the orthogonal projection of the c-axis on the front surface and each exposed on both the front surface and the back surface, and
the GaN substrate has on a side surface thereof a first point which is positioned in a direction perpendicular to the c-axis when viewed from the center of the substrate, and a single diffraction peak appears in an X-ray diffraction pattern obtained by θ scan in which an X-ray (CuKα$_1$: wavelength: 0.1542 nm) is incident to the first point, and the incident angle θ of the incident X-ray is varied while the 2θ angle of the diffracted X-ray is fixed to twice the Bragg angle of 28.99° of the {11-20} plane.

2. The GaN substrate according to claim 1, wherein the first point is positioned on an orientation flat with a length of less than 20 mm provided on the outer circumference of the substrate.

3. The GaN substrate according to claim 1, wherein a half-value width of the diffraction peak is less than 0.5°.

4. The GaN substrate according to claim 1, wherein a low index plane most nearly parallel to the front surface is any crystal plane selected from {10-10}, {30-31}, {30-3-1}, {20-21}, {20-2-1}, {30-32}, {30-3-2}, {10-11} and {10-1-1}.

5. The GaN substrate according to claim 1, wherein the GaN substrate is a GaN crystal having concentrations of alkali metals and halogen of less than $1\times10^{15}$ cm$^{-3}$ and an absorption coefficient at 450 nm of 2 cm$^{-1}$ or less.

6. The GaN substrate according to claim 1, wherein the GaN substrate is a GaN crystal which gives an infrared absorption spectrum where a peak assigned to a gallium vacancy-hydrogen complex is not observed between 3,100 and 3,500 cm$^{-1}$.

7. A disk-shaped GaN substrate comprising:
a front surface tilted with a tilt angle of 45° or more and 135° or less relative to the (0001) plane in a tilt direction within a range of ±5° around a <10-10> direction; and
a back surface which is a main surface opposite to the front surface, wherein the GaN substrate has a diameter of 70 mm or more, and
the GaN substrate has on a side surface thereof a first point positioned in a direction perpendicular to the c-axis when viewed from the center of the substrate, and a single diffraction peak appears in an X-ray diffraction pattern obtained by θ scan in which an X-ray (CuKα$_1$: wavelength: 0.1542 nm) is incident to the first point and the incident angle θ of the incident X-ray is varied while the 2θ angle of the diffracted X-ray is fixed to twice the Bragg angle of 28.99° of the {11-20} plane.

8. The GaN substrate according to claim 7, wherein the GaN substrate has a plurality of single crystal regions arranged in a row or two rows along the direction of the orthogonal projection of the c-axis on the front surface,
the GaN substrate has a diameter of 95 mm or more and 105 mm or less, and
each of the plurality of single crystal regions is exposed on both the front surface and the back surface.

9. The GaN substrate according to claim 7, wherein
the GaN substrate has a diameter of 105 mm or less, and
the first point is positioned on an orientation flat with a length of less than 40 mm provided on the outer circumference of the substrate.

10. The GaN substrate according to claim 7, wherein the GaN substrate has a plurality of single crystal regions arranged in two rows or three rows along the direction of the orthogonal projection of the c-axis on the front surface,
the GaN substrate has a diameter of 145 mm or more and 155 mm or less, and
each of the plurality of single crystal regions is exposed on both the front surface and the back surface.

11. The GaN substrate according to claim 7, wherein the GaN substrate has a diameter of 145 mm or more and 155 mm or less, and
the first point is positioned on an orientation flat with a length of less than 60 mm provided on the outer circumference of the substrate.

12. The GaN substrate according to claim 7, wherein a half-value width of the diffraction peak is less than 0.5°.

13. The GaN substrate according to claim 7, wherein a low index plane most nearly parallel to the front surface is any crystal plane selected from {10-10}, {30-31}, {30-3-1}, {20-21}, {20-2-1}, {30-32}, {30-3-2}, {10-11} and {10-1-1}.

14. The GaN substrate according to claim 7, wherein the GaN substrate is a GaN crystal having concentrations of alkali metals and halogen of less than $1\times10^{15}$ cm$^{-3}$ and an absorption coefficient at 450 nm of 2 cm$^{-1}$ or less.

15. The GaN substrate according to claim 7, wherein the GaN substrate is a GaN crystal which gives an infrared absorption spectrum where a peak assigned to a gallium vacancy-hydrogen complex is not observed between 3,100 and 3,500 cm$^{-1}$.

* * * * *